United States Patent
Takahashi et al.

(10) Patent No.: US 7,126,835 B2
(45) Date of Patent: Oct. 24, 2006

(54) SEMICONDUCTOR MEMORY DEVICE

(75) Inventors: Hiroyuki Takahashi, Kanagawa (JP); Toshifumi Takahashi, Kanagawa (JP)

(73) Assignee: NEC Electronics Corporation(JP)

( * ) Notice: Subject to any disclaimer, the term of this patent is extended or adjusted under 35 U.S.C. 154(b) by 101 days.

(21) Appl. No.: 10/798,368

(22) Filed: Mar. 12, 2004

(65) Prior Publication Data
US 2004/0184298 A1     Sep. 23, 2004

(30) Foreign Application Priority Data
Mar. 17, 2003   (JP)   ............................. 2003-071510

(51) Int. Cl.
*G11C 5/06*   (2006.01)
(52) U.S. Cl. ..................... 365/63; 365/149; 365/230.06
(58) Field of Classification Search .................. 365/63, 365/149, 230.06
See application file for complete search history.

(56) References Cited

U.S. PATENT DOCUMENTS

| | | | |
|---|---|---|---|
| 6,136,645 A * | 10/2000 | Yang et al. | 438/254 |
| 6,459,632 B1 * | 10/2002 | Itou | 365/149 |
| 6,545,904 B1 * | 4/2003 | Tran | 365/63 |
| 2003/0117832 A1 * | 6/2003 | Tomishima | 365/149 |
| 2004/0037107 A1 * | 2/2004 | Matsuoka | 365/149 |
| 2005/0052939 A1 * | 3/2005 | Osabe et al. | 365/232 |

FOREIGN PATENT DOCUMENTS

JP    2000-124331    4/2000

* cited by examiner

*Primary Examiner*—Huan Hoang
(74) *Attorney, Agent, or Firm*—Dickstein, Shapiro, LLP.

(57) ABSTRACT

A memory cell has a first switching element, a second switching element and a storage capacitor and formed in an active region. A first bit line and a first word line are connected to the first switching element and a second bit line and a second word line are connected to the second switching element. A plurality of the memory cells are formed within the active region which extends in a straight line. The active region extends at an angle with respect to the bit and word lines. The active region thus has no bent portions. The deterioration of the characteristics of the memory cell caused by the bent portions can be prevented.

16 Claims, 10 Drawing Sheets

| ROW ADDRESS SIGNAL XAdd | COLUMN ADDRESS SIGNAL YAdd | SELECTED MEMORY CELL | SELECTED WORD LINE | SELECTED BIT LINE |
|---|---|---|---|---|
| * * * * 0 | * * * * * | MN-2 | W11 | B12 |
| * * * * 1 | * * * * * | MN | W12 | B12 |
| * * * * 0 | * * * * * | MN+1 | W13 | B12 |

| ROW ADDRESS SIGNAL XAdd | COLUMN ADDRESS SIGNAL YAdd | SELECTED MEMORY CELL | SELECTED WORD LINE | SELECTED BIT LINE |
|---|---|---|---|---|
| * * * * 0 | * * * * 0 | MN-2 | W21 | B22 |
| * * * * 1 | * * * * 1 | MN | W22 | B23 |
| * * * * 0 | * * * * 0 | MN+1 | W23 | B22 |

SEMICONDUCTOR MEMORY DEVICE

BACKGROUND OF THE INVENTION

1. Field of the Invention

The present invention relates to a semiconductor memory device, in particular to a semiconductor memory device provided with memory cells that are configured by one data storage capacitor and two switching elements.

2. Description of Related Art

Memory cells each of which is configured by one data storage capacitor, and one switching element (transistor), are known as dynamic random access memory (DRAM) cells. The memory cells are referred to as "one-transistor/one-capacitor (1T/1C)" memory cells. Data access to 1T/1C memory cell is performed by using the one transistor and the refresh is performed by using the same transistor. Accordingly, data access to a memory cell on a bit line cannot be performed for a period during which the refresh is performed to a memory cell on the same bit line. High speed access to the memory is thus difficult.

In contrast to the 1T/1C memory cell, a two-transistor/one-capacitor (2T/1C) memory cell in which two switching elements (transistors) are connected to one capacitor has been proposed. Such a memory cell is disclosed in Japanese Patent Laid-Open Application No. 2000-124331. As shown in FIG. 10, drains of a first MOS transistor Tr1 and a second MOS transistor Tr2 are connected to one capacitor C. A first bit line B1 is connected to a source of the first MOS transistor Tr1, and a second bit line B2 is connected to a source of the second MOS transistor Tr2. Further, a first word line W1 is connected to a gate of the first MOS transistor Tr1, and a second word line W2 is connected to a gate of the second MOS transistor Tr2. In such 2T/1C memory cell M, if one of the transistors Tr1 and Tr2 is used for data write-in and the other transistor is used for data read-out, then data write-in and data read-out can be performed at the same timing to different memory cells on the same bit line. Alternatively, if one of the transistors Tr1 and Tr2 is used for data write-in and data read-out, and the other transistor is used for refresh, then data write-in, data read-out, and refresh can be performed at the same timing to different memory cells on the same bit line. It thus becomes possible to achieve high speed access to the memory cells.

A layout structure of 2T/1C memory cell is proposed in JP2000-124331. As shown in FIG. 11, an active region DA extends in a diagonal direction with respect to the word lines and the bit lines, which are mutually orthogonal. The first MOS transistor Tr1 and the second MOS transistor Tr2 are configured by the first word lines W1 and the second word lines W2 within the active region DA. Each of the MOS transistors Tr1 and Tr2 is connected to the first bit line B1 and to the second bit line B2, through bit line contacts BC. It should be noted that "active region" in this specification means a region that is formed on a semiconductor substrate, surrounded by an element separation region, in which diffusion layers, and a channel region that is sandwiched by the diffusion layers, are formed in order to configure a memory cell. Furthermore, A capacitor contact CC is provided in the diffusion layer shared by the first and second transistors Tr1 and Tr2 and is connected to a capacitor. The active regions DA of adjacent memory cells are formed in a zigzag pattern and are mutually continuous so that the plurality of memory cells arranged in a bit line direction are connected to the first bit line B1 and the second bit line B2.

Alternatively, a configuration disclosed in FIG. 1 of JP 2000-124331, but not shown here, has also been proposed. In this configuration, the active regions take on a different shape having a bent portion like that of a crank. A configuration disclosed in FIG. 8 of JP 2000-124331 has also been proposed. In this configuration, the diffusion layers of the plurality of memory cells that are arranged along the bit lines are formed in a linear shape extending in a direction that is parallel to the bit lines. Branch lines protrude out from the bit lines and are connected to the MOS transistors of each memory cell.

The Zigzag shape of the active regions DA as shown in FIG. 11 accompanies bent portions X in an outer edge of the active region pattern. The active regions DA may easily lose their shape in the bent portions X when the active regions are formed in the semiconductor substrate by using a photolithography technique, and it is difficult to form the active regions into shapes as designed. In addition, stress tends to be caused in the semiconductor substrate in the portions that have lost their shape. In particular, an angular portion of the active region may become rounded, and the width dimension of the active region in this portion may decrease. If this loss of shape is caused in the active regions, a target gate width will not be obtained. Further, electrical leakage fluctuation may be caused between the semiconductor substrate and the diffusion layers within the active regions due to stress. The problem may cause the decline of MOS transistor performance and deterioration of data retention characteristics of the memory cells. Accordingly, it is necessary to consider loss of shape of the active layers and stress, and design the active regions with a certain margin therefor. This becomes an impediment in miniaturizing the active regions, namely, an impediment in miniaturizing the memory cells.

Further, the layout structure cited in FIG. 1 of JP 2000-124331 has the same problems due to its bent portion. On the other hand, there are no bent portions in the active regions in the layout structure cited in FIG. 8 of JP 2000-124331. With the layout structure, although the problems that accompany the bent portions are eliminated, the branch lines extending from the bit lines must be formed, and contact failures will be caused and the securing the margin is needed due to loss of shape in the branch lines. As a result, impediments in miniaturizing the memory cells cannot be avoided.

In addition, in the layout structure shown in FIG. 11, each capacitor CC of adjacent memory cells has a narrower spacing in the bit line direction than in the word line direction. Accordingly, if one tries to increase the planar surface area of the capacitors formed on an upper layer of the MOS transistors in order to increase the data storage volume, the planar shape of the capacitors cannot simply be made into a rectangular shape having one long side. As a result, the planar shape of the capacitors becomes complex, and there is a problem in that manufacturing of capacitors is difficult.

SUMMARY OF THE INVENTION

A semiconductor memory device of the present invention includes, a plurality of word lines each extending in a first direction, a plurality of bit lines each extending in a second direction perpendicular to the first direction, a plurality of active regions formed on a semiconductor substrate and each extending linearly in a direction different from the first and second directions, each of the active region crossing three word lines and more and crossing three bit lines and more, and a plurality of memory cells formed on in the active regions, each the memory cell including a data storage capacitor, a first switching element connected to the data storage capacitor, and a second switching element connected to the data storage capacitor.

A semiconductor memory device of the present invention includes, a plurality of word lines, a plurality of bit lines, a plurality of active regions formed on a semiconductor substrate and defined by an element separation region, a boundary between an active region and the element separation region being substantially linear between at least three adjacent word lines, and a plurality of memory cells formed on a semiconductor substrate, each the memory cell including a data storage capacitor, a first switching element connected to the data storage capacitor, and a second switching element connected to the data storage capacitor, each of the memory cells connected to a corresponding one of the word lines and a corresponding one of the bit lines.

A semiconductor memory device of the present invention includes, a first row decoder driving at least first and second word lines, a second row decoder driving at least third and fourth word line, first, second and third bit lines, a first memory cell having a first capacitor, a first switching element coupled between the first capacitor and the first bit line and coupled to the first word line, and a second switching element coupled between the first capacitor and the second bit line and coupled to the third word line, and a second memory cell having a second capacitor, a first switching element coupled between the second capacitor and the first bit line and coupled to the second word line, and a second switching element coupled between the second capacitor and the third bit line and coupled to the fourth word line.

According to the semiconductor memory device of the present invention, bent portions are not formed in the active regions that configure the plurality of memory cells, or the number of bent portions can be reduced. Deterioration in the characteristics of the memory cells caused by the bent portions is prevented, the memory cells can be miniaturized, and it becomes possible to improve the data retention characteristics of the memory cells.

BRIEF DESCRIPTION OF THE DRAWINGS

The above and other objects as well as advantages of the present invention will become clear by the following description of the preferred embodiments of the present invention with reference to the accompanying drawings, wherein.

DETAILED DESCRIPTION OF PREFERRED EMBODIMENTS

Figure 1:
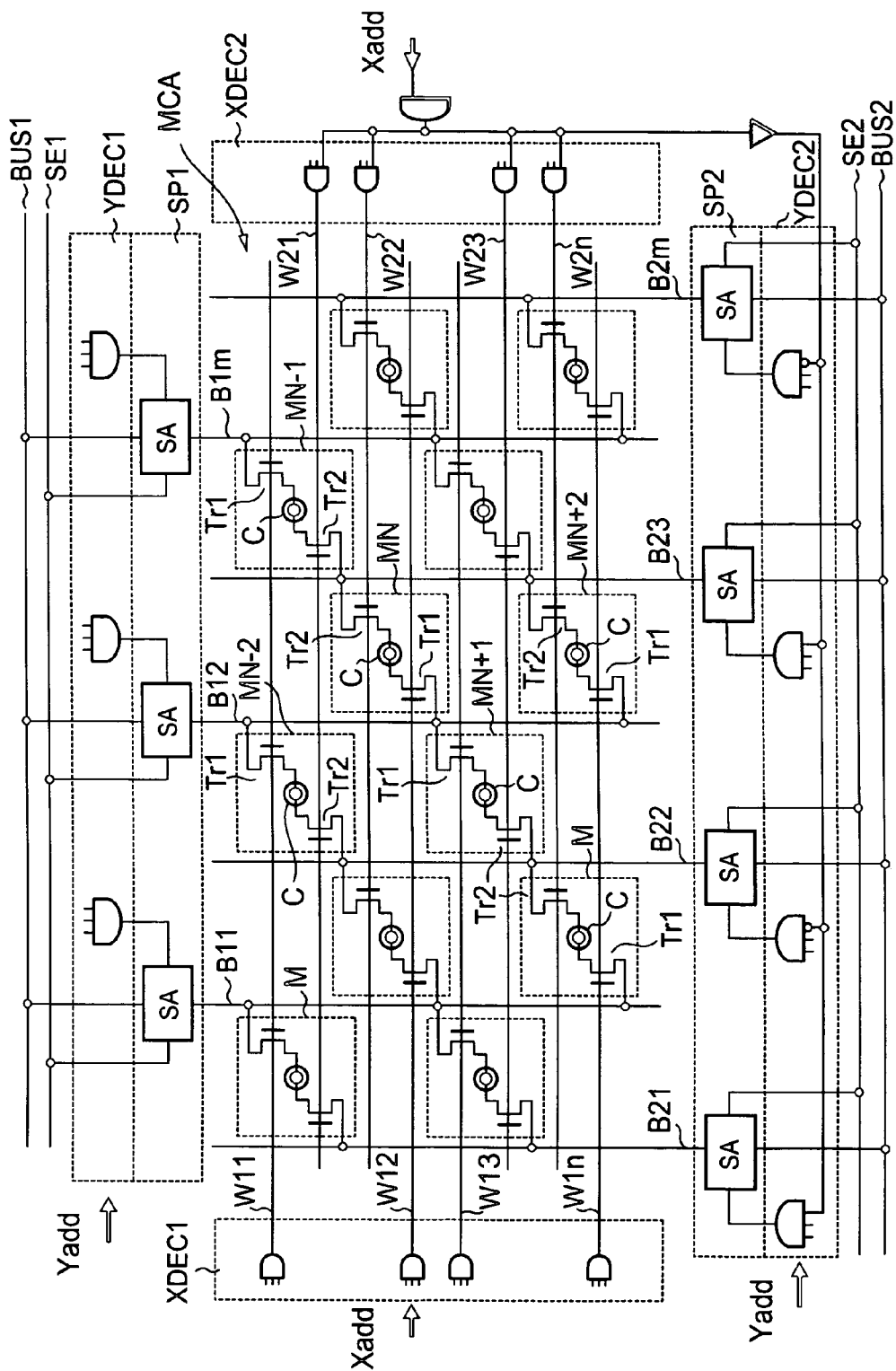
FIG. 1 is a schematic circuit diagram showing a configuration of a circuit of a first embodiment of a semiconductor memory device of the present invention.

FIG. 1 is a circuit diagram of a semiconductor memory device of a first embodiment of the present invention. A plurality of memory cells M that configure a memory cell array MCA each have a 2T/1C structure. Each memory cell is connected to a first word line W1 (from among first word lines W11 to W1$n$) and a second word line W2 (from among second word lines W21 to W2$n$), and a first bit line B1 (from among first bit lines B11 to B1$m$) and a second bit line B2 (from among second bit lines B21 to B2$m$) That is, two adjacent word lines of a plurality of word lines form pairs as the first word line and the second word line. The first word lines W1 are connected to a first X decoder (row decoder) XDEC1. The second word lines W2 are connected to a second x decoder XDEC2. Further, the first bit lines B1 and the second bit lines B2 are arranged alternately in a longitudinal direction of the word lines (hereinafter called row direction) and are connected to each memory cell M. The first bit lines B1 are connected to a first Y decoder (column decoder) YDEC1 through a first sense amplifier/pre-charger circuit SP1. The second bit lines B2 are connected to a second Y decoder YDEC2 through a second sense amplifier/pre-charger circuit SP2.

Drains of a first MOS transistor Tr1 and a second MOS transistor Tr2, which are used as a first switching element and a second switching element, are connected to one capacitor C. Further, in each memory cell a gate of the first MOS transistor Tr1 is connected to the first word line W1, and a gate of the second MOS transistor Tr2 is connected to the second word line W2. In addition, a source of the first MOS transistor Tr1 is connected to the first bit line B1, and a source of the second MOS transistor Tr2 is connected to the second bit line B2. In one memory cell, the first transistor Tr1 is connected to the bit line B1 which is used by an adjacent memory cell on one side and the second transistor Tr2 is connected to the bit line B2 which is used by an adjacent memory cell on the opposite side.

For example, as seen from a memory cell MN in FIG. 1, the source of the first MOS transistor Tr1 of the memory cell MN is connected to the first bit line B12, and the source of the second MOS transistor Tr2 is connected to the second bit line B23. Further, in a memory cell MN+1, which is one memory cell adjacent to the memory cell MN, the source of the first MOS transistor Tr1 is connected to the same first bit line B12, while the source of the second MOS transistor Tr2 is connected to the second bit line B22 different from the second bit line B23. Similarly, in a memory cell MN−1, which is another memory cell adjacent to the memory cell MN, the source of the second MOS transistor Tr2 is connected to the second bit line B23, while the source of the first transistor Tr1 is connected to the first bit line B1$m$ different from the first bit line B12. In addition, in a memory cell MN-2 that is formed in an active region which is adjacent to the memory cell MN, the connections are similar to those of the N+1th memory cell. The source of the first MOS transistor Tr1 in the memory cell MN-2 is connected to the first bit line B12, while the source of the second MOS transistor Tr2 is connected to the different second bit line B22.

Row address signals XAdd are input to the first X decoder XDEC1 and the second X decoder XDEC2, thus selecting the first word line W1 and the second word line W2, respectively. Further, column address signals YAdd are input to the first Y decoder YDEC1 and the second Y decoder YDEC2. The first sense amplifier/pre-charger circuit SP1 and the second sense amplifier/pre-charger circuit SP2 is connected to a bus line BUS1 and a bus line BUS2 and activated by from an enable signal line SE1 and an enable signal line SE2. The sense amplifier is selected by the decoded signal output from the decoder YDEC1, 2. The first bit line B1 and the second bit line B2 are thus selected. The least significant bit of the row address signal XAdd, which is input to the second X decoder XDEC2, is input to the second Y decoder YDEC2 as a partial bit row address signal. By using a configuration in which the least significant bit is reciprocally input to one input terminal of every second AND gate that selects the second bit lines B2 in a row direction, every second of the second bit lines B2 in the row direction is selected alternately as a group accompanying gradual increases (increment) or decreases (decrement) in the row address signal. The one input terminal every second AND gate in the row direction is connected to an inverting gate here.

Figure 2:
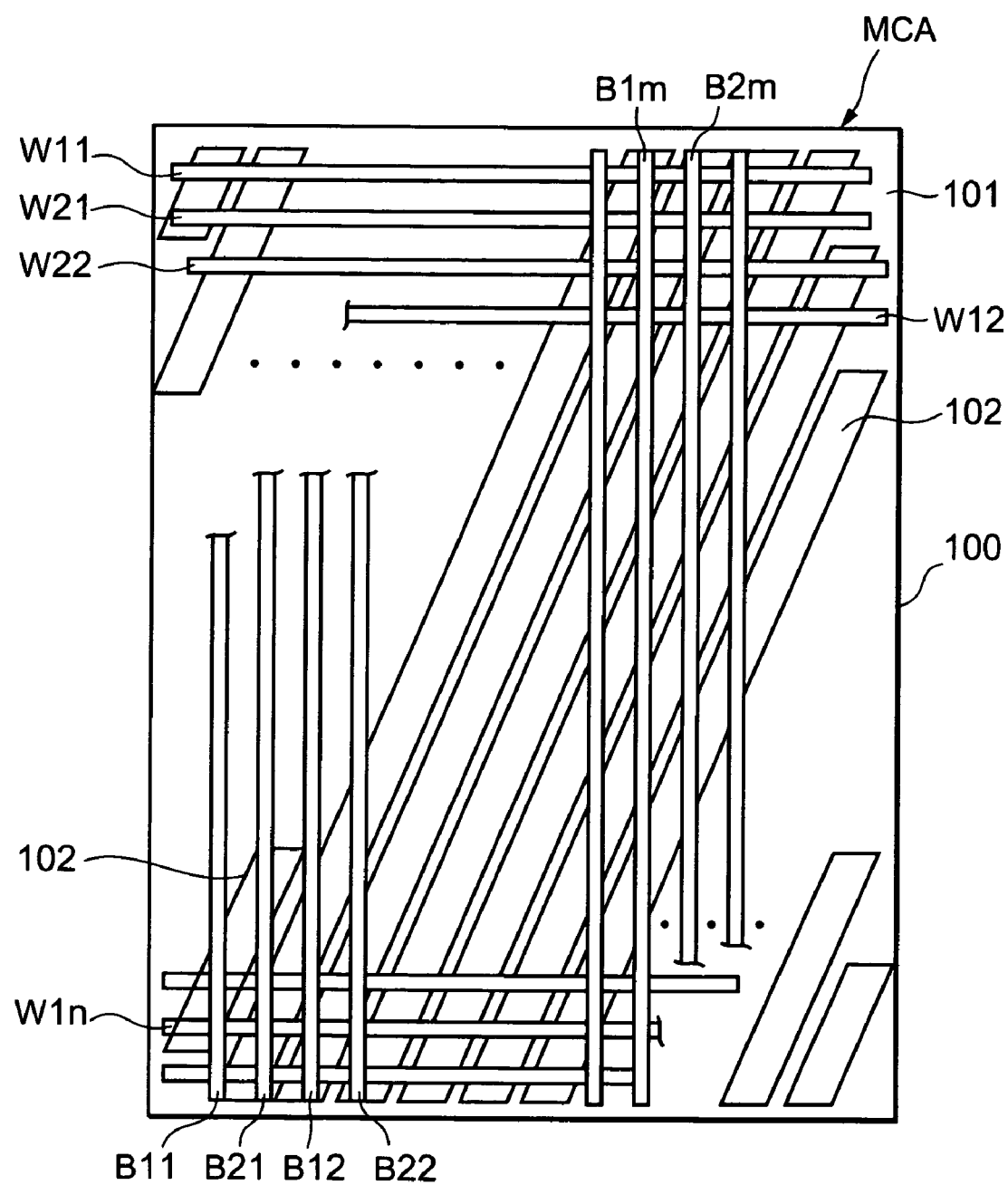
FIG. 2 is a layout diagram of a memory cell of the semiconductor memory device of the present invention.

FIG. 2 is a layout diagram of the entire configuration of the memory cell array MCA that is formed in a semiconductor substrate of the semiconductor memory device shown in FIG. 1. It should be noted that, for convenience hereinafter, a left and right direction in FIG. 2 is referred to as a row direction, and a vertical up and down direction is referred to as a column direction. An element separation region 101 is formed in a semiconductor substrate 100. Element forming regions are configured as active regions 102 that are surrounded by the element separation region 101. Shallow Trench Isolation (STI), in which a silicon oxide film is buried within a shallow groove formed on a surface of the semiconductor substrate, is employed as the element separation region 101. The active regions 102 are each formed in a straight line pattern as a band having a necessary width that is disposed obliquely with respect to the row direction and the column direction. A plurality of the active regions 102 with this pattern are arranged on the semiconductor substrate 100 having necessary gaps in the row direction (or the column direction).

The active regions 102 are formed with as long a length as possible over a necessary region of the semiconductor substrate that configures the memory cell array MCA. As described below, a plurality of memory cells are arranged in series across a longitudinal direction of each active region 102. The first word lines W1 and the second word lines W2, which extend in the row direction on the plurality of memory cells, extend in a state where their sequence order alternately reverses. Further, the first bit lines B1 and the second bit lines B2, which extend in the column direction on an upper layer on the same memory cells, extend alternately.

Figure 3:
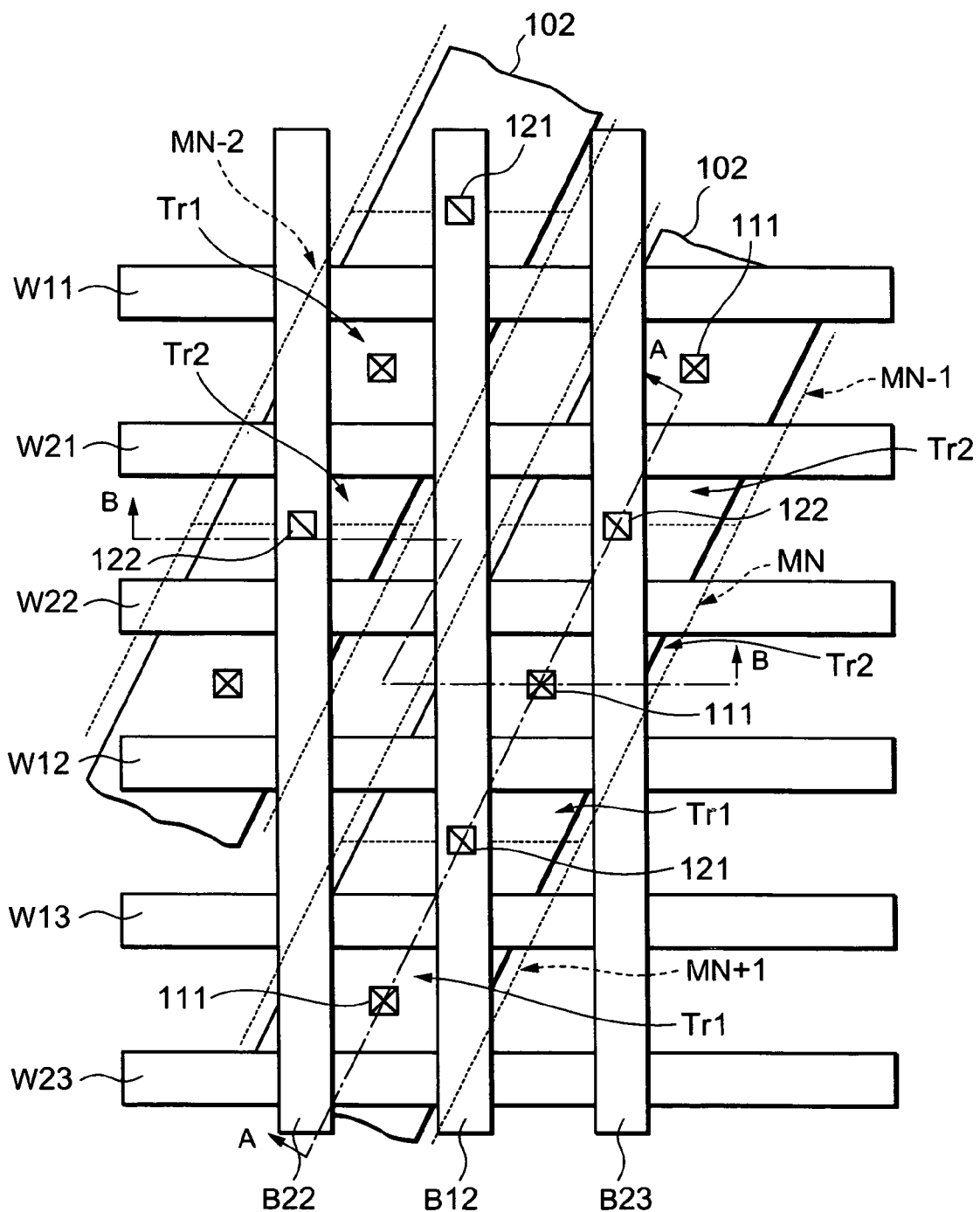
FIG. 3 is a blow-up view of a portion of FIG. 2.

FIG. 3 is a blow-up view of a portion of the memory cell array MCA of FIG. 2, and is a blow-up view of the vicinity of the memory cell MN shown in FIG. 1. The first MOS transistor Tr1 and the second MOS transistor Tr2 are arranged in one memory cell MN having shared drain regions in the longitudinal direction of the active region 102. Capacitor contacts 111 are formed in the shared drain regions. Further, source regions are formed in both outer sides of both of the MOS transistors Tr1 and Tr2, opposite the drain region and sandwiching channel regions. Bit line contacts 121 and 122 are formed in the source regions. The first word line W12 and the second word line W22, which form a pair with respect to the memory cell MN, extend on the first MOS transistor Tr1 and the second MOS transistor Tr2, respectively. Further, a capacitor described later is connected to the capacitor contacts 111. The first bit line B12 and the second bit line B23 are connected to the first bit line contact 121 and the second bit line contact 122, respectively.

Furthermore, in the same active region 102, the memory cell MN-1 and the memory cell MN+1, which are adjacent to the one memory cell MN in the longitudinal direction, are each similarly provided with the first MOS transistor Tr1 and the second MOS transistor Tr2. However, an arrangement direction of the first MOS transistors Tr1 and the second MOS transistors Tr2 in the adjacent memory cells is toward a direction that is opposite that used in the one memory cell MN. This is an axially symmetric arrangement with a boundary between the memory cells, that is, the locations at which the bit line contacts 121 and 122 are disposed, as an axis of symmetry. Accordingly, the source regions of the first MOS transistors Tr1 or the second MOS transistors Tr2, which are adjacent in the one memory cell MN and in the adjacent memory cell MN-1, or the adjacent memory cell MN+1, are shared. The bit contact lines 121 and 122 on each of the source regions are also shared.

The first word lines W1 and the second word lines W2 that extend on each memory cell are therefore disposed so that their sequence order is reversed in adjacent memory cells. That is, in word line pairs of adjacent memory cells, the first word lines W1 and the second word lines W2 are disposed so that the first word lines W1, or the second word lines W2, are adjacent. Further, the first bit lines B1 or the second bit lines B2 are commonly connected by the first MOS transistors Tr1 or the second MOS transistors Tr2 of adjacent memory cells.

In addition, the plurality of active regions 102 arranged on the semiconductor substrate 100 are disposed at necessary intervals in the longitudinal direction of the word lines and the longitudinal direction of the bit lines. Moreover, adjacent active regions 102 are disposed so that the first bit line contact 121 or the second bit line contact 122 of the memory cell MN, and the memory cell MN-2, which has a structure that is axially symmetric to the memory cell MN, coincide on the same line in the longitudinal direction of the bit line. In the example of FIG. 3, the memory cells MN and MN-2 are disposed so that the first bit line contact 121 of the memory cell MN and the first bit line contact 121 of the memory cell MN-2 become disposed on the same first bit line B12. The first MOS transistor Tr1 and the second MOS transistor Tr2 of each memory cell thus become disposed on the same row direction straight line in adjacent active regions 102. The first word line W1 and the second word line W2, which extend across each memory cell of a plurality of active regions, thus extend on the first MOS transistor Tr1 and the second MOS transistor Tr2 in each memory cell. On the other hand, the first bit line B1 and the second bit line B2, which extend across each memory cell of a plurality of active regions, become connected to the first bit line contact 121 or the second bit line contact 122 of the one memory cell and an adjacent memory cell that is disposed with symmetry to the one memory cell.

Figure 4:
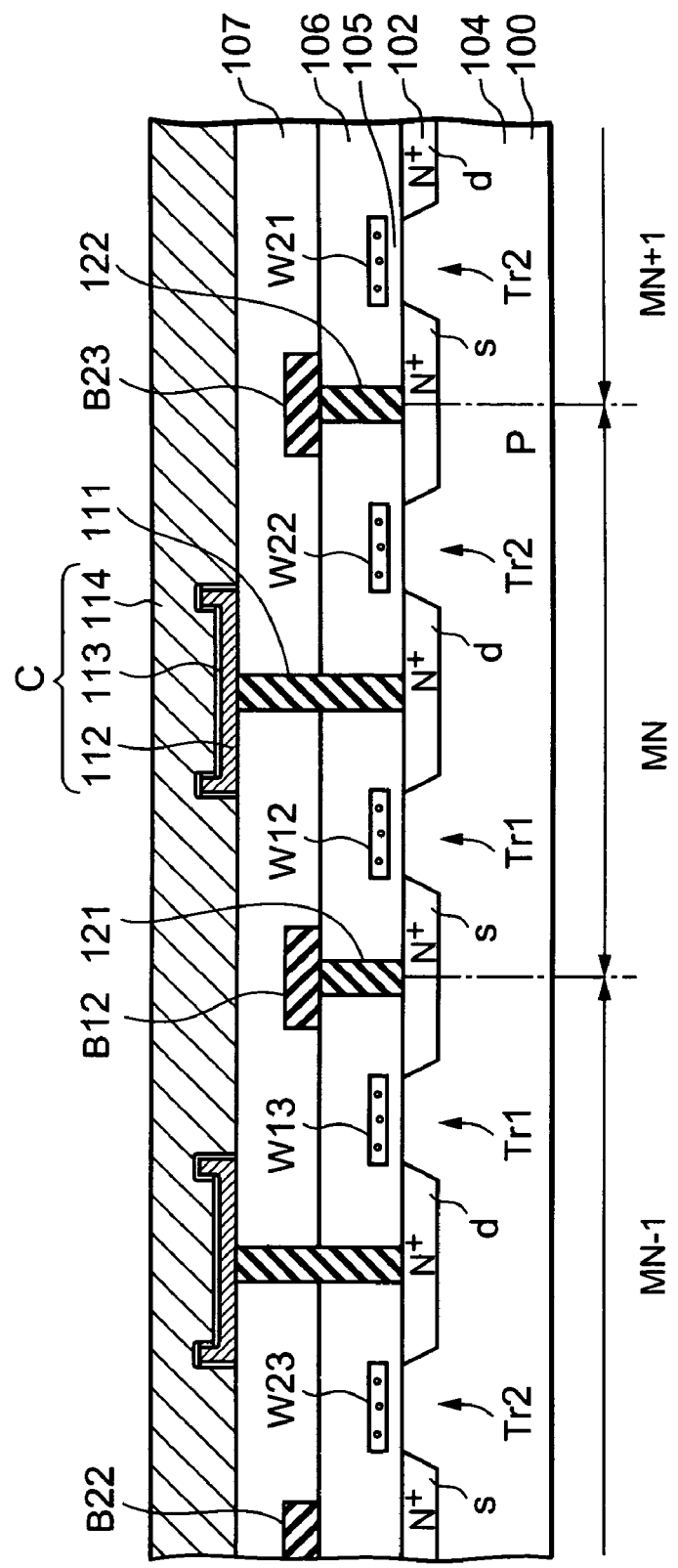
FIG. 4 is a blow-up cross-sectional view along a line segment A—A of FIG. 3.
Figure 5:
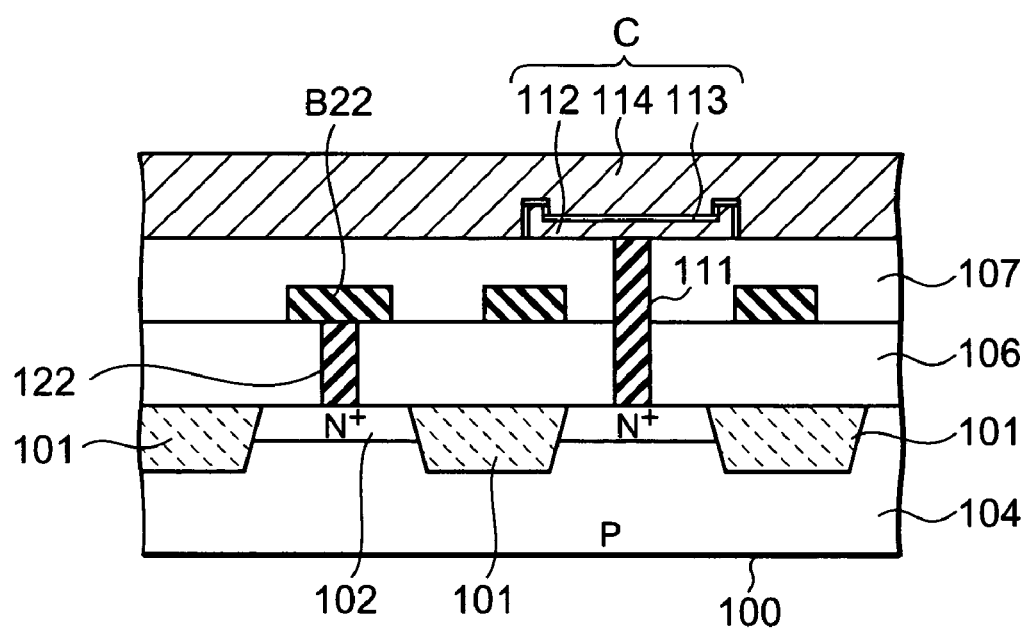
FIG. 5 is a blow-up cross sectional view along a line segment B—B of FIG. 3.

A configuration of the memory cells M that are formed in the active regions 102 is explained next. FIG. 4 and FIG. 5 are cross sectional views along a line segment A—A, and a line segment B—B, of FIG. 3, respectively. The semiconductor substrate 100 has a single conductivity type (P-type here) epitaxial layer 104. The epitaxial layer 104 is separated by the element separating region 101 made by the STI or the like, thus forming the active regions 102. A thermal silicon oxide film is formed on surfaces of the active regions 102 as gate insulators 105. The first word lines W1 (W12 and W13) and the second word lines W2 (W21, W22, and W23) made from polysilicon are formed extending in the row direction on the gate insulators 105, with necessary intervals in the column direction. The first word lines W1 and the second word lines W2 extend in a continuous state over a plurality of arranged active regions, as described above. In the active region 102, the first MOS transistors Tr1 and the second MOS transistors Tr2 are configured by the first word lines and the second word lines, with channel regions directly under each word line. Regions surrounded by the first word lines and the second word lines are formed as common drain regions d of the first MOS transistors and the second MOS transistors. Outer regions of the first word lines W1 and the second word lines W2 are configured as source regions S of the first MOS transistors Tr1 and the second MOS transistors Tr2.

An interlayer insulating film 106 is formed on the word lines W1 and the word lines W2. The bit line contacts 121 and 122 that connect to the source regions s of the first MOS transistors Tr1 and the second MOS transistors Tr2 are formed in the interlayer insulating film 106. The bit line contacts 121 and 122 are formed as conductive plugs in which a conductive material is buried in contact holes opened in the interlayer insulating film 106.

The plurality of the first bit lines B1 (B12) and the second bit lines B2 (B23), which connect to the bit line contacts 121 and 122, respectively, are formed on the interlayer insulating film 106 extending in the column direction, orthogonal to the word lines W1 and W2, at necessary intervals in the row direction. The first bit lines B1 and the second bit lines B2 are connected to the source regions s through the bit line contacts 121 and 122, respectively. The bit lines are disposed such that the first bit lines B1 and the second bit lines B2 alternately in the row direction. Further, the bit lines are arranged so that the memory cells M are disposed with a deviation in adjacent active regions 102. The first bit lines B1 are thus connected to the source regions of the first MOS transistors Tr1, and the second bit lines B2 are connected to the source regions of the second MOS transistors Tr2, in the memory cells of each of the active regions 102.

A second interlayer insulating film 107 is formed on the interlayer insulating film 106. The capacitor contacts 111 that connect to the common drain d of the first MOS transistors Tr1 and the second MOS transistors Tr2 are formed in the second interlayer insulating film 107. Cylindrical capacitor lower portion electrodes 112 that connect to the capacitor contacts 111 are then formed on the second interlayer insulating film 107. The cylindrical capacitor lower portion electrodes 112 connect to the common drain regions d through the capacitor contacts 111. Capacitor insulating films 113 are formed on a surface of the capacitor lower portion electrodes 112. A capacitor common electrode 114 that configures a common capacitor upper portion electrode is formed on the capacitor insulating films 113. The cylindrical capacitor lower portion electrodes 112, the capacitor insulating films 113, and the capacitor common electrode 114 therefore configure the capacitors C shown in FIG. 1.

It should be noted that the dimension of the active regions 102 in the longitudinal direction is formed sufficiently longer than the lengths of the memory cells M across the entire region of the memory cell array MCA. Accordingly, a plurality of memory cells are arranged across the longitudinal direction within one continuous active region 102, in a state where the sequence order of the first MOS transistor and the second MOS transistor is reversed. Further, the first MOS transistors Tr1 or the second MOS transistors Tr2 are formed to line up adjacently in adjacent memory cells in the longitudinal direction of the active region 102. The source regions of the adjacent MOS transistors are configured as a common source region for both memory cells, and the bit line contacts 121 and 122 are provided to the source regions.

The memory cells and the memory cell array of the semiconductor memory device having the circuit configuration shown in FIG. 1 are configured according to a layout structure of this type. In particular, the first MOS transistor Tr1 and the second MOS transistor Tr2 of each memory cell are connected in a parallel state with respect to the first word line W1 and the second word line W2, which form a pair, in the row direction in the memory cells arranged in the row direction and the column direction of the memory cell array MCA. In the column direction, the first MOS transistor Tr1 and the second MOS transistor Tr2 of each memory cell are alternately connected to different first bit lines B1 and different second bit lines B2, as explained in FIG. 1.

Referring to FIG. 1, according to this semiconductor memory device, The first MOS transistor Tr1 in each memory cell is taken as a write-in switching element, and the second MOS transistor Tr2 is taken as a read-out/refresh switching element, for example. During write-in of data to each memory cell M, the first word line W1 that is connected to an object memory cell is selected by the row address signal XAdd that is input to the first X decoder XDEC1. Further, the first bit line B1 that is connected to the object memory cell is selected by the column address signal YAdd that is input to the first Y decoder YDEC1. The first MOS transistor Tr1 of the object memory cell thus turns on, and the capacitor C of the object memory cell M is connected to the first bit line B1. Then, data from the bus line BUS1 passes through the first sense amplifier/pre-charger circuit SP1, and is stored in the capacitor C of the object memory cell M.

Figures 6A, 6B:
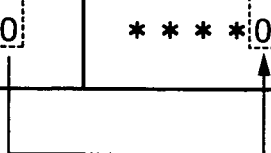
FIGS. 6A and 6B are diagrams for explaining selection operations of a memory cell.

For example, as shown in FIG. 6A, when the first word lines W11, W12, and W13 are selected in order by the row address signal XAdd that is input to the first X decoder XDEC1, and the first bit line B12 is selected by the column address signal YAdd that is input to the first Y decoder YDEC1, the memory cells MN−2, MN, and MN+1 are selected in order, and the first MOS transistor Tr1 of each memory cell MN−2, MN, and MN+1 turns on. Accordingly, it becomes possible to write in data to the capacitor C of each memory cell, through the first bit line B12.

On the other hand, when data recorded in the memory cell M is read out, the row address signal XAdd that is input to the second X decoder XDEC2 selects the second word line W2, and the column address signal YAdd that is input to the second Y decoder YDEC2 selects the second bit line B2. The second MOS transistor of the memory cell thus selected turns on, the capacitor C is connected to the second bit line B2, and the second sense amplifier/pre-charger circuit SP2 reads out data to the bus line BUS2. Also, data refresh is made in the same manner.

When the address of the row address signal XAdd increases or decreases sequentially at this point, the second bit line B2 that is connected to the second transistor Tr2 changes sequentially. However, the least significant bit of the row address signal XAdd is input to the least significant bit of the second Y decoder YDEC2. Every other second bit line B2 is therefore selected alternately following increases or decreases of the row address signal XAdd for cases where the row address signal XAdd is even and for cases where the address signal XAdd is odd.

For example, as shown in FIG. 6B, when the second word lines W21, W22, and W23 are selected in order by the row address signal XAdd that is input to the second X decoder XDEC2, and the second bit line B22 is selected by the column address signal YAdd that is input to the second Y decoder YDEC2, the least significant bit of the row address signal XAdd is input as the least significant bit of the column address signal YAdd to each sense amplifier of the sense amplifier/pre-charger circuit SP2. The adjacent sense amplifiers therefore alternately change between being active and inactive for cases where the least significant bit is odd, "1", and for cases where the least significant bit is even, "0".

Accordingly, the second bit line B22 becomes selected for cases where the memory cell MN−2 is selected by the second word line W21. Next, the least significant bit of the row address signal XAdd inverts when the second word line W22 of the next row address selects the memory cell MN. Accordingly, the second Y decoder YDEC2 selects the adjacent second bit line B23. In addition, when the object memory cell becomes the memory cell MN+1 by the next row address signal XAdd, and the second word line B23 is selected, the least significant bit of the row address signal XAdd again inverts and returns to its former value. Accordingly, the initial second bit line B22 becomes selected by the second Y decoder YDEC2.

Regarding the plurality of memory cells that are arranged in the column direction along the first bit line B1, one of the two second bit lines that sandwich the memory cells thus becomes selected according to increases and decreases in the row address of the word line. The second bit line B2 that is connected to the second MOS transistors of the plurality of memory cells that are arranged in the column direction is thus connected to the second column decoder YDEC2, and it thus becomes possible to access the memory cells. Data read-out from the object memory cells according to the second sense amplifier/pre-charger circuit SP2 therefore becomes possible through the selected second bit line B2. It should be noted that data refresh is similar.

As described above, with an embodiment of the semiconductor memory device of the present invention the memory cell array MCA shown in FIG. 1 can be configured by forming the memory cell active regions 102 in the semiconductor substrate 100 in a straight line band shape. Data write-in to, data read-out from, and data refresh of each memory cell M in the memory cell array MCA thus become possible. It therefore becomes possible to perform data write-in operations, and data write-out/data refresh operations simultaneously when accessing the memory cell array MCA as long as a data write-in address and a data write-out/data refresh address are not identical. High speed operation similar to that of other one-capacitor/two-transistor memory cell structures already proposed is of course possible.

Figure 7:
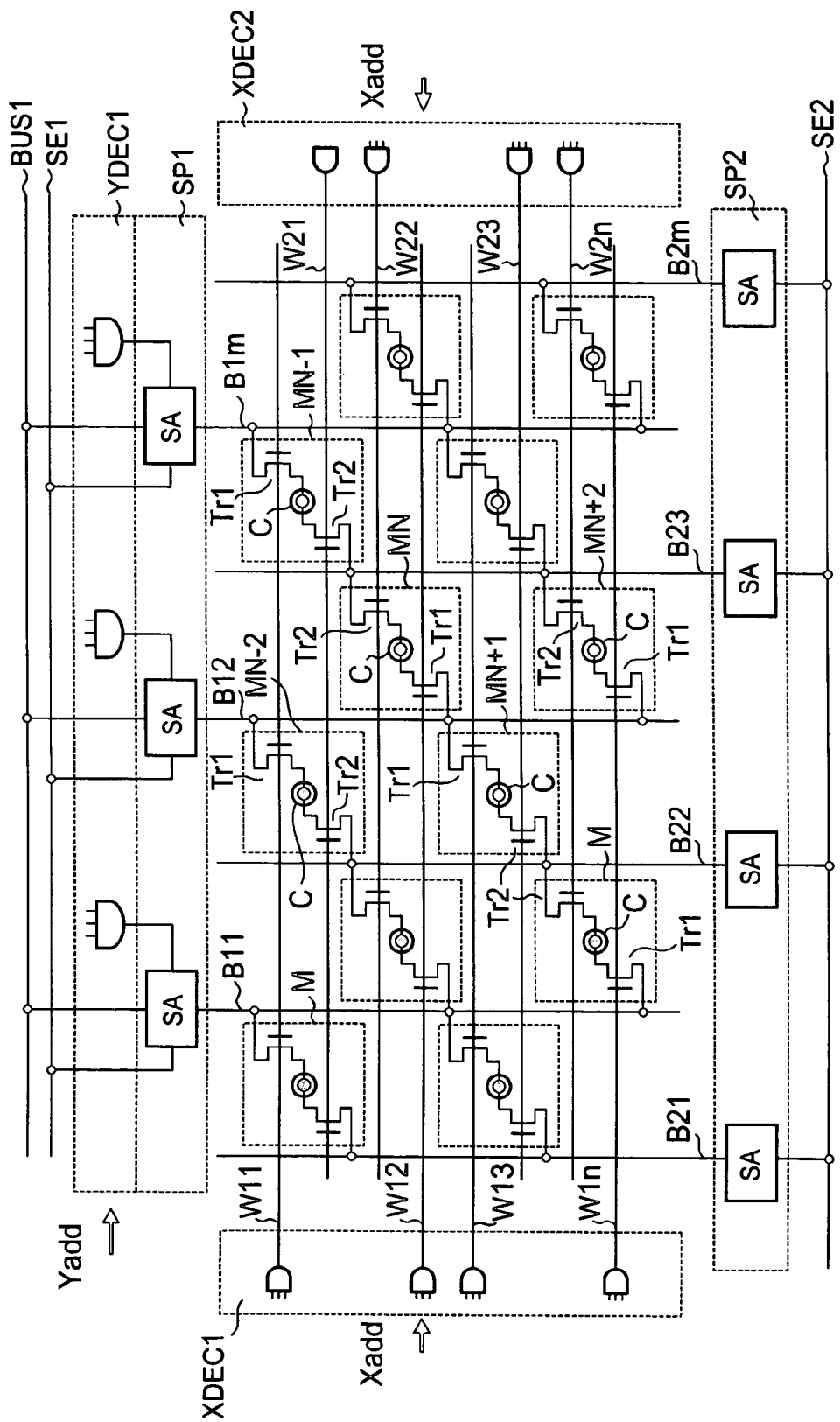
FIG. 7 is a schematic circuit diagram showing a configuration of a second embodiment of the semiconductor memory device of the present invention.

Further, it is also possible to take the first MOS transistor Tr1 of each memory cell as a write-in/write-out switching element, and take the second MOS transistor Tr2 of each memory cell as a specialized refresh switching element as a second embodiment of the present invention. As shown in FIG. 7, the first X decoder XDEC1 and the second X decoder XDEC2, and only the first Y decoder YDEC1 need to be formed in this case. The second Y decoder YDEC2 like that of the first embodiment becomes unnecessary. Accordingly, the first sense amplifier/pre-charger circuit SP1 is connected to the first bit lines B1 along with the first Y decoder YDEC1, and only the second sense amplifier/pre-charger circuit SP2 is connected to the second bit lines B2. A configuration like that of the first embodiment in which the least significant bit of the row address signal XAdd is removed and input to the second X decoder XDEC2 is therefore not employed here.

In this embodiment, the memory cells are selected by the row address signal XAdd that is input to the first X decoder XDEC1, and the column address signal YAdd that is input to the first Y decoder YDEC1. Data write-in and data read-out are then performed. Access operations at this point are similar to those shown in FIG. 6A. On the other hand, when performing data refresh, all of the sense amplifiers that are connected to the second bit lines B2 are placed in an active state by the second sense amplifier/pre-charger circuit SP2. The second word lines W2 are selected in order by the row address signal YAdd that is input to the second X decoder XDEC2. For example, by selecting the second word lines W21, W22, and W23 in turn, the memory cells MN−2, MN, and MN+1 are selected one after another. The second MOS transistor Tr2 of each memory cell turns on, and it becomes possible to perform data refresh. The configuration of the semiconductor memory device can thus be simplified.

Figure 11:
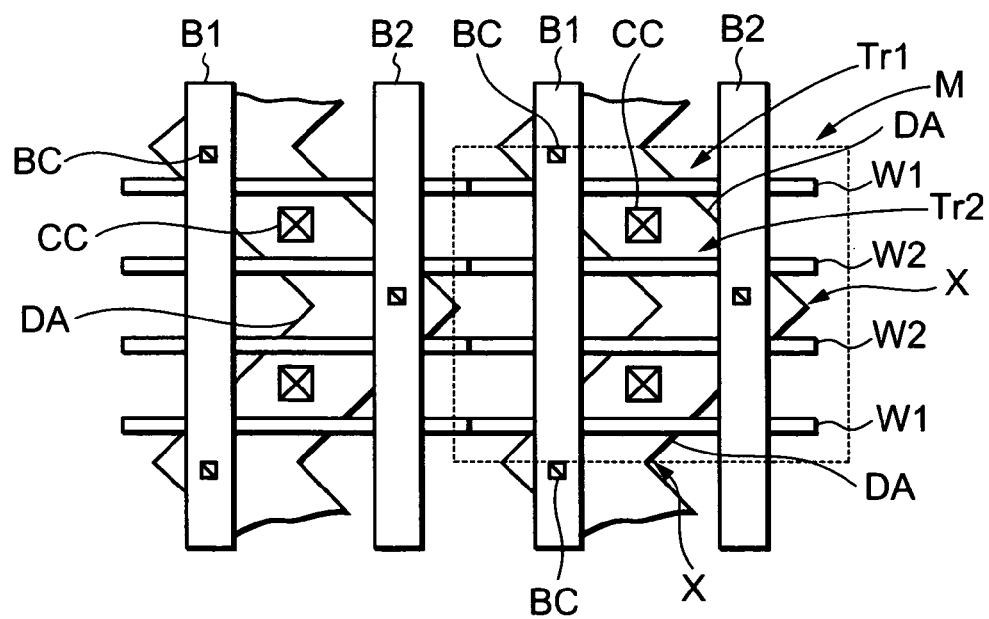
FIG. 11 is a layout diagram of an example of a conventional semiconductor-memory device.

Furthermore, the plurality of memory cells formed in the semiconductor substrate 100 are formed by the active regions 102 in one straight line band shape pattern, and therefore extremely few bent portions exist in the active regions across the plurality of memory cells. As shown in FIG. 11, one memory cell is formed in an oblique pattern shape with a conventional active region pattern. Other memory cells continuous with the one cell are formed in an oblique pattern that is toward an opposite direction. When looking at a plurality of the memory cells, the conventional technique has a zigzag shape pattern. Bent portions develop in continuous active regions, and loss of shape due to a photolithography technique develops in the bent portions, and a necessary width dimension of diffusion layers within the active regions cannot be obtained. Alternatively, stress develops, generating electrical leak dispersion, and in addition, ensuring a margin of error is required due to the loss of shape, as explained above. However, bent portions are not required across the plurality of memory cells in this embodiment. Accordingly, conventional problems caused by the bent portions do not develop. The performance of the MOS transistors therefore increases. That is, the data retention characteristics of the memory cells can be improved, and it becomes possible to miniaturize the memory cells.

On the other hand, it becomes possible to form the word lines and the bit lines straight in the row direction and the column direction, respectively, with no relation to the fact that the active regions that configure the memory cells are given an pattern shape that is oblique with respect to the row direction and the column direction. It is not-necessary to form branches from the bit lines in order to connect the bit lines to the memory cells, as with layout structure cited in FIG. 8 of in JP2000-124331 A. Problems such as contact irregularities, and the ability to ensure the margin or error due to the loss of shape in the branches can therefore be avoided, and further, this embodiment is advantageous in miniaturizing the memory cells.

Figure 8:
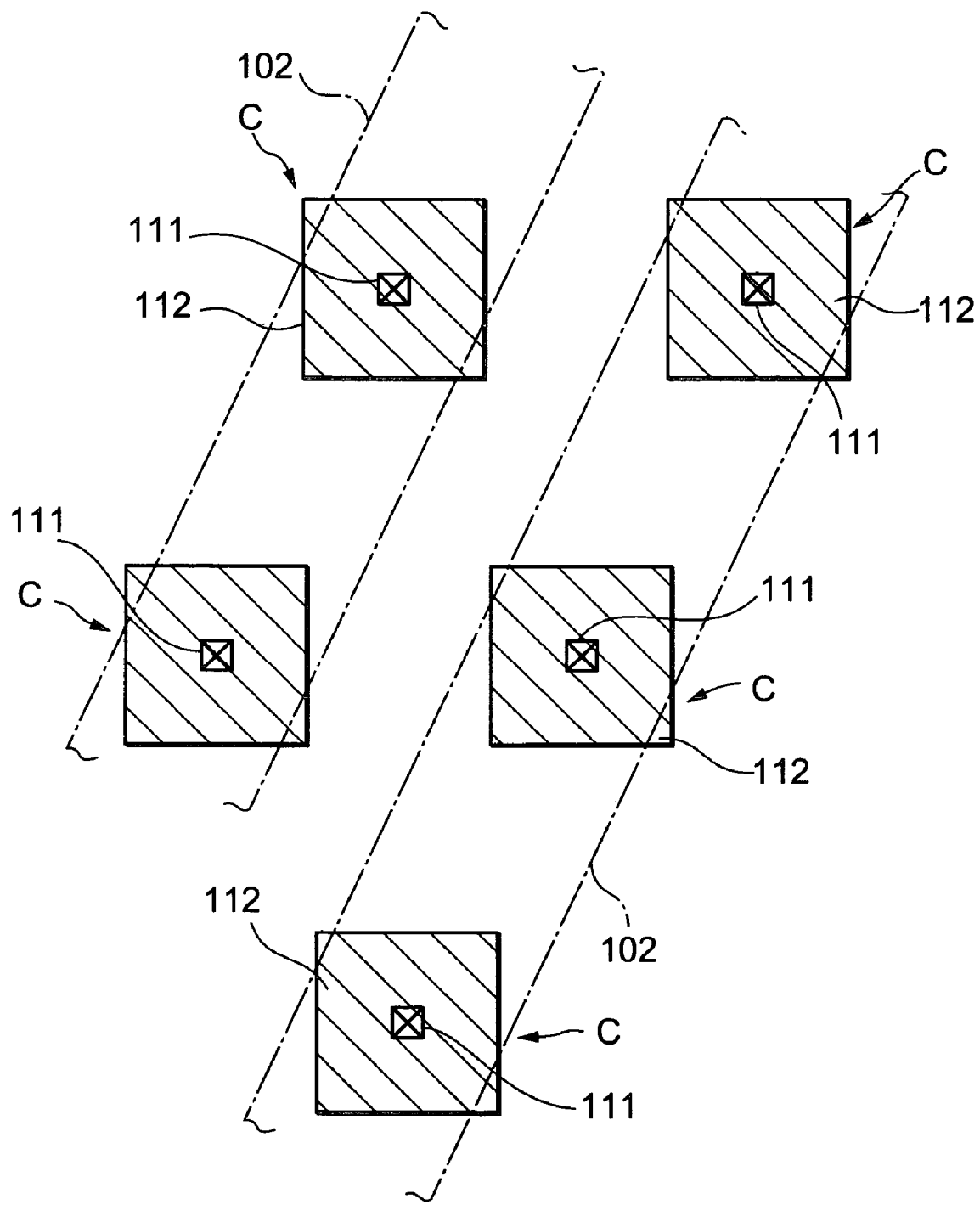
FIG. 8 is a layout diagram for capacitor contacts and capacitors.

In addition, adjacent active regions 102 are staggered in the row direction and the column direction at necessary intervals in the present invention. The capacitor contacts 111 of each memory cell M are therefore disposed at substantially the same interval in the row direction and the column direction, as shown in FIG. 8. Accordingly, even for cases where the capacitors C formed on the capacitor contacts 111, that is, the planer shape capacitor lower portion electrodes 112, are designed having a rectangular shape, the storage capacity of each capacitor can be made as large as possible. It thus becomes possible to easily perform design and manufacture of the capacitors.

Figure 9:
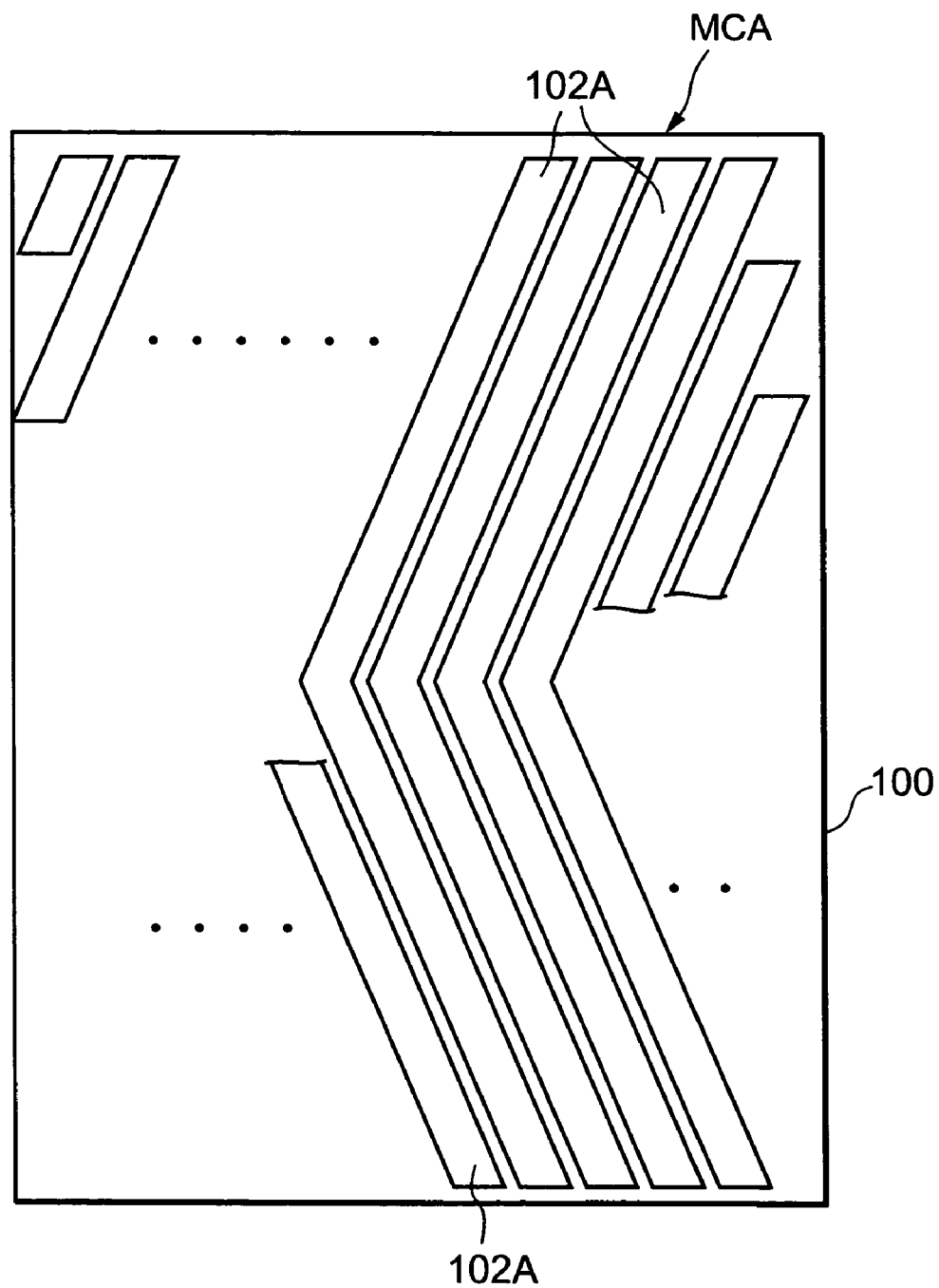
FIG. 9 is a layout diagram of a second embodiment of a memory array of the semiconductor device of the present invention.
Figure 10:
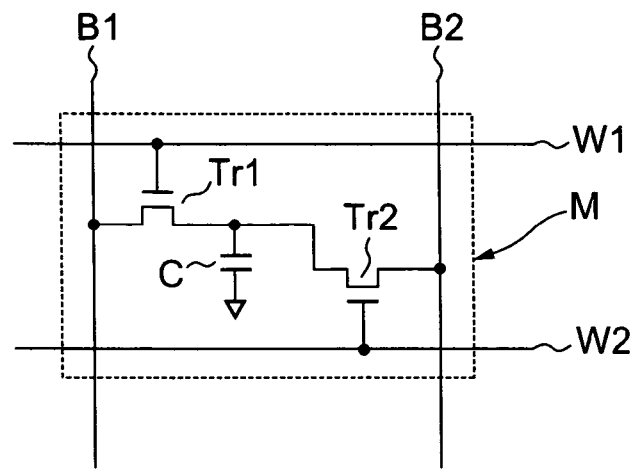
FIG. 10 is a circuit diagram of a memory cell intended for the present invention.

In the previous embodiment, the plurality of active regions is formed having an oblique pattern in one direction across the entire memory cell array. However, the active regions may also be bent into a zigzag pattern in peripheral portions of the memory array MCA, like active regions 102A shown in FIG. 9. Although there is a partial commonality with the structure of JP 2000-124331 A in that bent portions are required, in this invention the plurality of memory cells are arranged in regions where the active regions are linearly continuous. It is therefore possible to reduce the overall number of bent portions compared to the conventional structure of FIG. 11 in which the active regions are bent for every single memory cell. This is advantageous in eliminating the problems caused by the bent portions.

Further, in the previous embodiments, the first MOS transistor of one memory cell is used for data write-in, or is used for data write-in and data read-out, and the second MOS transistor is used for data read-out or for data refresh. It is of course possible to arbitrarily design the first MOS transistors and the second MOS transistors to be freely used as any type of switching element.

With the present invention as explained above, a layout structure is employed in which memory cells that are configured by a data storage capacitor, a first switching element, and a second switching element configure a memory cell array on a semiconductor substrate. A plurality of the memory cells are formed within active regions that extend linearly in a direction that is oblique with respect to word lines and bit lines, which extend in mutually orthogonal directions. Bent portions are therefore not required in the active regions, or the number of bent portions can be reduced. Deterioration of the characteristics of the memory cells caused by the bent portions can thus be prevented, the miniaturization of the memory cells can be achieved, and it becomes possible to improve the data retention characteristics of the memory cells.

What is claimed is:

1. A semiconductor memory device comprising:
a plurality of word lines each extending in a first direction;
a plurality of bit lines each extending in a second direction crossing said first direction;
a straight active region extending in a direction different from said first and second directions, said active region crossing three or more word lines and three or more bit lines;
a plurality of memory cells formed in said active region, wherein each said memory cell includes a data storage capacitor, a first switching element connected to said data storage capacitor, and a second switching element connected to said data storage capacitor;
a capacitor contact connected to the data storage capacitor and formed on said active region between the adjacent first and second word lines;
a first bit line contact connected to a first one of said bit lines and arranged such that said first word line is sandwiched between said capacitor contact and said first bit line contact; and
a second bit line contact connected to a second one of said bit lines and arranged such that said second word line is sandwiched between said capacitor contact and said second bit line contact.

2. A semiconductor memory device comprising:
a plurality of word lines each extending in a first direction;
a plurality of bit lines each extending in a second direction crossing said first direction;
a straight active region extending in a direction different from said first and second directions, said active region crossing three or more word lines and three or more bit lines
a plurality of memory cells formed in said active region; and
a plurality of bit line contacts each connected to a single bit line, there being four word lines between the adjacent bit line contacts.

3. A semiconductor memory device comprising:
a plurality of word lines each extending in a first direction;
a plurality of bit lines each extending in a second direction crossing said first direction;
a straight active region extending in a direction different from said first and second directions, said active region crossing three or more word lines and three or more bit lines;
a plurality of memory cells formed in said active region; wherein each said memory cell includes a data storage capacitor, a first switching element connected to said data storage capacitor, and a second switching element connected to said data storage capacitor; and
a first row decoder driving a first set of said word lines, said first set coupled to said first switching elements;
a second row decoder driving a second set of said word lines, said second set coupled to said second switching elements, said second row decoder receiving a row address signal;
a first column decoder selecting a first group of said bit lines, said first group coupled to said first switching elements; and
a second column decoder selecting a second group of said bit lines, said second group coupled to said second switching elements, said second column decoder receiving a portion of said row address signal.

4. The device as claimed in claim 3, wherein when said second row decoder drives said second set of said word lines based on one of incrementing and decrementing of said row address signal, said second column decoder alternatively selects the bit lines adjacent to each other among said second group.

5. A semiconductor memory device comprising:
a plurality of word lines each extending in a first direction;
a plurality of bit lines each extending in a second direction crossing said first direction;
a straight active region extending in a direction different from said first and second directions, said active region crossing three or more word lines and three or more bit lines;
a plurality of memory cells formed in said active region; wherein each said memory cell includes a data storage capacitor, a first switching element connected to said data storage capacitor, and a second switching element connected to said data storage capacitor; and a first row decoder driving a first set of said word lines, said first set coupled to said first switching elements, said first row decoder being activated when data access is performed to a selected memory cell;
a second row decoder driving a second set of said word lines, said second set coupled to said second switching elements, said second decoder receiving a refresh address signal;
a first column decoder selecting a first group of said bit lines, said first group coupled to said first switching elements; and
a sense amplifier circuit sensing a second group of said bit lines, said second group coupled to said second switching element, said sense amplifier circuit being controlled by a sense enable signal and not controlled by an address signal.

6. A semiconductor memory device comprising:
a plurality of word lines;
a plurality of bit lines;
an active region formed on a semiconductor substrate and defined by an element separation region, a boundary between said active region and said element separation region being substantially straight between at least three adjacent word lines;
a plurality of memory cells formed on the semiconductor substrate, wherein each said memory cell includes a data storage capacitor, a first switching element connected to the data storage capacitor, and a second switching element connected to the data storage capacitor, each of said memory cells connected to a corresponding one of said word lines and a corresponding one of said bit lines;
a capacitor contact connected to the data storage capacitor and formed on said active region between the adjacent first and second word lines;
a first bit line contact connected to a first one of said bit lines and arranged such that said first word line is sandwiched between said capacitor contact and said first bit line; and
a second bit line contact connected to a second one of said bit lines and arranged such that said second word line is sandwiched between said capacitor contact and said second bit line.

7. The device as claimed in claim 6, wherein said active region substantially extends from end to end of a memory cell array area.

8. The device as claimed in claim 6, said device further comprising:
a plurality of bit line contacts each connected to a single bit line, there being four word lines between the adjacent bit line contacts.

9. The device as claimed in claim 6, said device further comprising:
a first row decoder driving a first set of said word lines, said first set coupled to said first switching elements;
a second row decoder driving a second set of said word lines, said second set coupled to said second switching elements, said second row decoder receiving a row address signal;
a first column decoder selecting a first group of said bit lines, said first group coupled to said first switching elements; and
a second column decoder selecting a second group of said bit lines, said second group coupled to said second switching elements, said second column decoder receiving a portion of said row address signal.

10. The device as claimed in claim 9, wherein when said second row decoder drives said second set of said word lines based on one of incrementing and decrementing of said row address signals, said second column decoder alternatively selects the bit lines adjacent to each other among said second group.

11. The device as claimed in claim 6, said device further comprising:
a first row decoder driving a first set of said word lines, said first set coupled to said first switching elements, said first row decoder being activated when data access is performed to a selected memory cell;
a second row decoder driving a second set of said word lines, said second set coupled to said second switching elements, said second decoder receiving a refresh address signal;
a first column decoder selecting a first group of said bit lines, said first group coupled to said first switching elements; and
a sense amplifier circuit sensing a second group of said bit lines, said second group coupled to said second switching element, said sense amplifier circuit being controlled by a sense enable signal and not controlled by an address signal.

12. A semiconductor memory device comprising:
a first row decoder driving at least first and second word lines;
a second row decoder driving at least third and fourth word lines;
first, second and third bit lines;
a first memory cell having a first capacitor, a first switching element coupled between said first capacitor and said first bit line and coupled to said first word line, and a second switching element coupled between said first capacitor and said second bit line and coupled to said third word line;
a second memory cell having a second capacitor, a first switching element coupled between said second capacitor and said first bit line and coupled to said second word line, and a second switching element coupled between said second capacitor and said third bit line and coupled to said fourth word line;
a first column decoder selecting at least said first bit line; and
a second column decoder selecting at least said second and third bit lines, said second column decoder receiving and using a portion of a row address signal.

13. The device as claimed in claim 12, said device further comprising:
a first sense amplifier coupled to said first bit line and controlled by a first sense enable signal;
a second sense amplifier coupled to said second bit line and controlled by a second sense enable signal; and
a third sense amplifier coupled to said third bit line and controlled by said second sense enable signal.

14. The device as claimed in claim 13, wherein said second and third sense amplifiers are not controlled by a row address signal.

15. The device as claimed in claim 12, wherein said first and second memory cells are formed on an active region which are designed in an elongate shape, an edge of said active region does not have a bent portion between said first and second memory cells.

16. The device as claimed in 15, wherein each of said first to fourth word lines extends in a first direction, each of said first to third bit lines extends in a second direction, said active region extends in a third direction different from said first and second directions.

* * * * *